United States Patent [19]

Dorri

[11] Patent Number: 5,623,430
[45] Date of Patent: Apr. 22, 1997

[54] METHOD FOR PASSIVELY SHIMMING AN OPEN MAGNET

[75] Inventor: Bizhan Dorri, Clifton Park, N.Y.

[73] Assignee: General Electric Company, Schenectady, N.Y.

[21] Appl. No.: 373,995

[22] Filed: Jan. 17, 1995

[51] Int. Cl.⁶ .................................. G01V 3/00; H01F 3/00
[52] U.S. Cl. .................... 364/578; 324/319; 324/320; 324/307; 324/322; 335/298; 335/301; 335/297; 335/216
[58] Field of Search ............................ 364/578; 395/500; 324/320, 318, 322, 319, 307, 309, 308; 335/216, 298, 301, 297, 296, 299, 302, 304, 306, 300; 128/653.2–653.5

[56] References Cited

U.S. PATENT DOCUMENTS

| | | | |
|---|---|---|---|
| 4,698,611 | 10/1987 | Vermilyea | 335/298 |
| 4,771,244 | 9/1988 | Vermilyea | 324/320 |
| 4,853,663 | 8/1989 | Vermilyea | 335/301 |
| 4,949,044 | 8/1990 | Starewicz et al. | 324/320 |
| 4,983,922 | 1/1991 | Tahara | 324/320 |
| 4,990,877 | 2/1991 | Benesch | 324/318 |
| 5,003,266 | 3/1991 | Palkovich et al. | 324/320 |
| 5,006,804 | 4/1991 | Dorri et al. | 324/320 |
| 5,045,794 | 9/1991 | Dorri et al. | 324/320 |
| 5,168,232 | 12/1992 | Glover et al. | 324/320 |
| 5,184,075 | 2/1993 | Nishimura | 324/309 |
| 5,194,810 | 3/1993 | Breneman et al. | 324/319 |
| 5,250,901 | 10/1993 | Kaufman et al. | 324/318 |
| 5,288,119 | 2/1994 | Crawford, Jr. et al. | 335/285 |
| 5,313,164 | 5/1994 | Starewicz et al. | 324/318 |
| 5,317,298 | 5/1994 | Dorri et al. | 335/297 |
| 5,329,266 | 7/1994 | Soeldner et al. | 324/319 |
| 5,343,183 | 8/1994 | Shimada et al. | 335/301 |
| 5,373,239 | 12/1995 | Marek et al. | 324/320 |
| 5,389,909 | 2/1995 | Havens | 335/216 |
| 5,400,786 | 3/1995 | Allis | 324/319 |
| 5,412,363 | 5/1995 | Breneman et al. | 335/216 |
| 5,418,462 | 5/1995 | Breneman et al. | 324/320 |
| 5,439,543 | 8/1995 | Dorri et al. | 156/184 |

*Primary Examiner*—Kevin J. Teska
*Assistant Examiner*—Jacques Louis-Jacques
*Attorney, Agent, or Firm*—Douglas E. Erickson; Marvin Snyder

[57] ABSTRACT

A method for passively shimming an open magnet having a magnetic field with an inhomogeneity including an amount of positive 2, 0 Legendre polynomial harmonics. The magnetic field is mapped and the amount of positive 2, 0 Legendre polynomial harmonics of the mapped magnetic field is determined. An adjusted magnetic field is defined equal to the mapped magnetic field minus a nonzero portion of the determined amount of positive 2, 0 Legendre polynomial harmonics. A computer shim code is run which calculates adding shims to reduce the inhomogeneity of the adjusted magnetic field. Shims are added to the open magnet as calculated from the running of the computer shim code.

10 Claims, 2 Drawing Sheets

METHOD FOR PASSIVELY SHIMMING AN OPEN MAGNET

BACKGROUND OF THE INVENTION

The present invention relates generally to shimming of magnets, and more particularly to passively shimming an open magnet.

Closed magnets have a single magnetic assembly with a bore in which is located the working magnetic field volume. Open magnets have two spaced-apart magnetic assemblies with generally coaxially aligned bores and a working magnetic field volume located in the open space between the magnetic assemblies. Open magnets have advantages in certain applications such as in MRI (magnetic resonance imaging) medical imaging where the open space helps the patient overcome any feelings of claustrophobia that may be experienced in a closed magnet design. Real magnets have an inhomogeneity of the magnetic field in the working magnetic field volume due to manufacturing tolerances and site conditions. In many applications, the open or closed magnet must be shimmed to reduce the inhomogeneity of the magnetic field in the working magnetic field volume to within a predetermined specification. For example, an open MRI magnet whose magnetic assemblies are superconductive coil assemblies must be shimmed to reduce the inhomogeneity of the magnetic field in its working magnetic field volume, which is its imaging volume, to within a few parts per million for use in medical diagnosis.

Known methods for shimming closed superconductive MRI magnets include active shimming and passive shimming. Active shimming typically requires a complex arrangement of superconductive shimming coils. Passive shimming typically involves the placement of carbon steel shims of calculated thickness in the bore of the closed magnet at calculated locations on the inside diameter of the superconductive coil assembly. The thickness and location of the shims are determined through use of a computer shim code, as is known to those skilled in the art, which calculates adding shims to reduce the inhomogeneity of the mapped magnetic field in the imaging volume of the closed MRI magnet. The calculated shims are added to the magnet, the magnetic field of the magnet is again mapped, and the computer shim code is again run. This process is repeated until the inhomogeneity of the measured magnetic field in the imaging volume is reduced to within a predetermined specification. The repetitive nature of the shimming process is the result of the computer shim code being only an approximation of the real magnet.

Typically the shimming process starts with approximating the measured magnetic field in the imaging volume in terms of a Legendre polynomial expansion, as is known to those skilled in the art. For closed superconductive MRI magnets having magnetic field inhomogeneities, a typical Legendre polynomial approximation of the magnetic field within the working magnetic field volume would include Legendre polynomial terms (harmonics) up to order 8 and degree 8, including 2, 0 Legendre polynomial harmonics (i.e., the Legendre polynomial term of order 2 and degree 0). A typical computer shim code (as mentioned in the previous paragraph) defines a function related to the measured magnetic field inhomogeneity as affected by the addition of shims and then calculates, in an iterative manner, the thickness and location of shims to be added to the magnet which minimizes the defined function.

Applicant encountered problems in trying to passively shim open magnets. Shims could not be placed in the open space between the magnetic assemblies, and a typical open magnet could only be conventionally shimmed from a peak-to-peak inhomogeneity of about 1,000 ppm (parts-per-million) to about 400 ppm. Applicant discovered that adding shims only to the magnetic assemblies could not create positive 2, 0 Legendre polynomial harmonics which were needed to compensate for negative 2, 0 Legendre polynomial harmonics created when shims were added to reduce inhomogeneities of other harmonics. Open magnets were designed by others to have built-in positive 2, 0 Legendre polynomial harmonics such as by having a larger separation between the magnetic assemblies or by initially adding full shim trays and then removing some shims to create positive 2, 0 Legendre polynomial harmonics. However, when Applicant used a typical shimming computer code to add shims to reduce the inhomogeneity of the mapped magnetic field of such a positive-2, 0-biased open magnet, it was found that such open magnet could only be shimmed from a peak-to-peak inhomogeneity of about 1,000 ppm (parts-per-million) to about 50 ppm. What is needed is an improved method for passively shimming an open magnet to even lower levels of inhomogeneity.

SUMMARY OF THE INVENTION

It is an object of the invention to provide a method for passively shimming an open magnet having positive 2, 0 Legendre polynomial harmonics.

The method of the invention is for passively shimming an open magnet having a magnetic field with an inhomogeneity including an amount of positive 2, 0 Legendre polynomial harmonics. The method includes the following steps. In step (a), the magnetic field is mapped. In step (b), the amount of positive 2, 0 Legendre polynomial harmonics of the mapped magnetic field of step (a) is determined. In step (c), an adjusted magnetic field is defined which is equal to the mapped magnetic field of step (a) minus a nonzero portion of the determined amount of positive 2, 0 Legendre polynomial harmonics of step (b). In step (d), a computer shim code is run which calculates adding shims to reduce the inhomogeneity of the adjusted magnetic field of step (c). In step (e), shims are added to the open magnet as calculated from the running of the computer shim code of step (d).

Several benefits and advantages are derived from the invention. Applicant found that by having the computer shim code operate on reducing the inhomogeneity of the adjusted magnetic field by adding shims, a typical open magnet having positive 2, 0 Legendre polynomial harmonics could have its peak-to-peak magnetic field inhomogeneity reduced from about 1,000 ppm to about 17 ppm. This compares to reducing the inhomogeneity of such open magnet from about 1,000 ppm to about 50 ppm with the conventional technique of having the computer shim code operate on reducing the inhomogeneity of the mapped magnetic field by adding shims.

BRIEF DESCRIPTION OF THE DRAWINGS

The accompanying drawings illustrate a preferred embodiment of the present invention wherein.

DETAILED DESCRIPTION OF THE INVENTION

Figure 1:
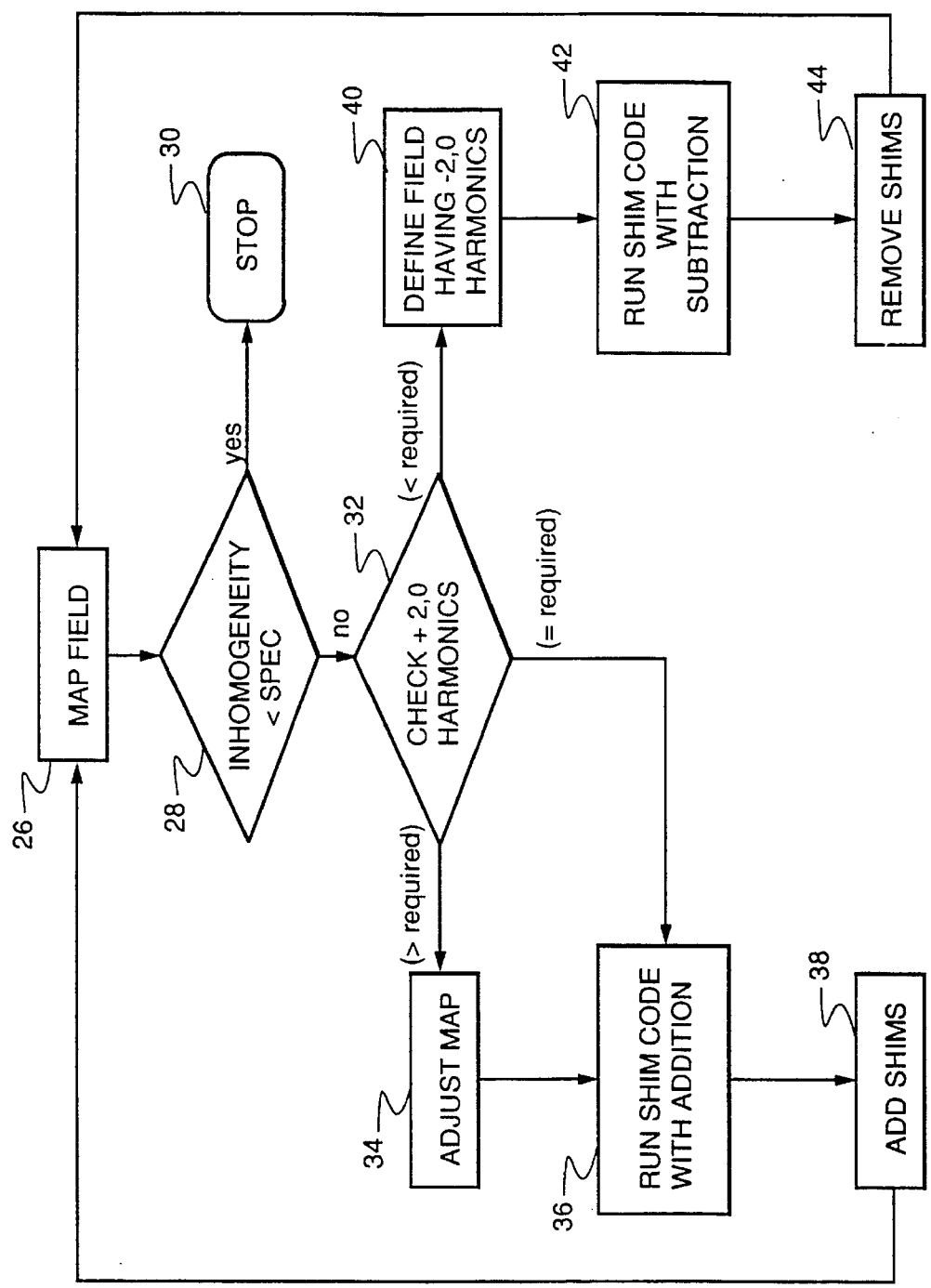
FIG. 1 is a block diagram (flow chart) of a preferred method of the present invention for passively shimming an open magnet having a magnetic field with an inhomogeneity including an amount of positive 2, 0 Legendre polynomial harmonics.
Figure 2:
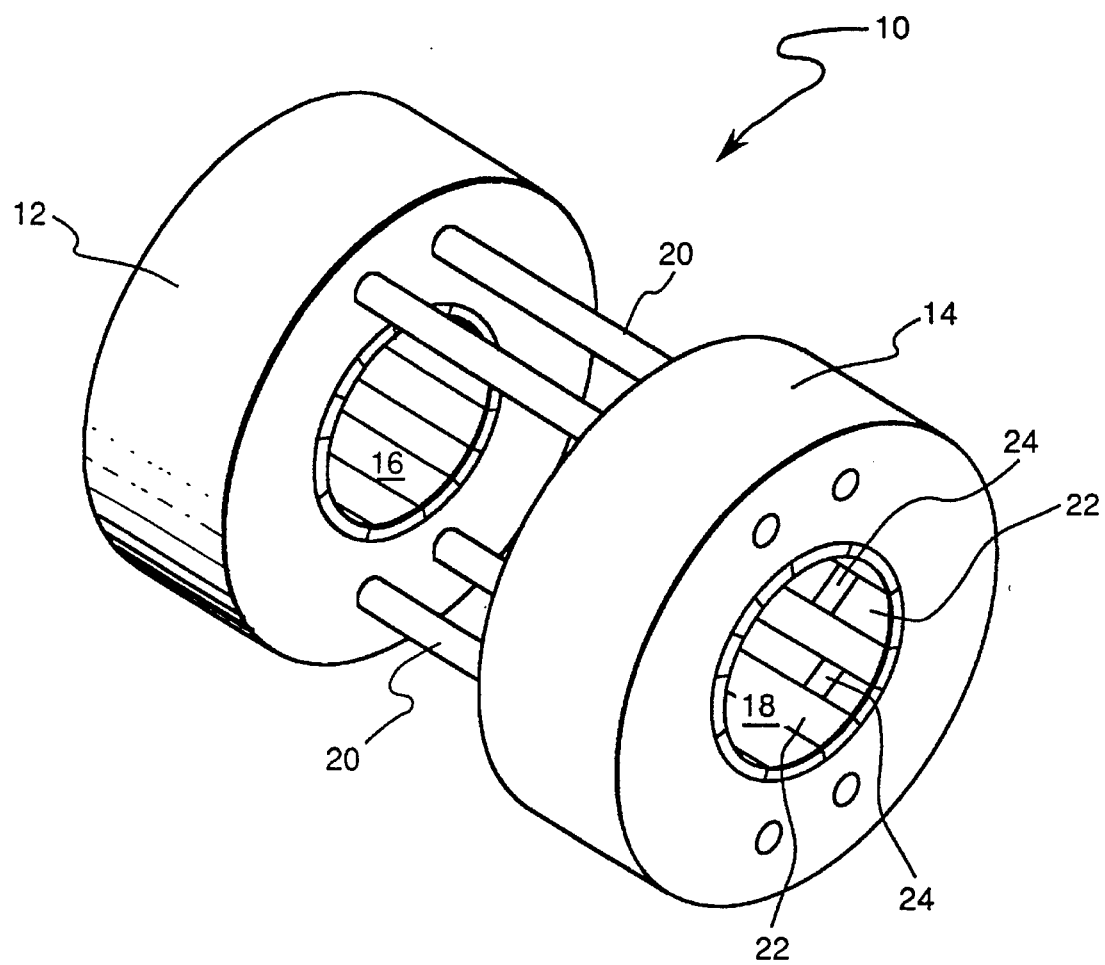
FIG. 2 is a perspective view of an open magnet to be passively shimmed by the method shown in FIG. 1.

Referring now to the drawings, wherein like numerals represent like elements throughout, FIG. 1 shows in block diagram form a preferred method of the invention for passively shimming an open magnet 10 (shown in FIG. 2) having a magnetic field with an inhomogeneity including an amount of positive 2, 0 Legendre polynomial harmonics. Preferably, the open magnet 10 is a superconductive open magnet having two spaced-apart superconductive coil assemblies 12 and 14 with generally coaxially aligned bores 16 and 18. In an exemplary embodiment, structural posts 20 support the superconductive coil assemblies 12 and 14. In a preferred embodiment, the open magnet 10 includes passive shim drawers (trays) 22 containing locations for the attachment of thicknesses of carbon steel passive shims 24 (only two of which are shown in FIG. 2). Preferably, each superconductive coil assembly 12 or 14 has twelve shim drawers 22 which move within rails (not shown), and each shim drawer 22 has eighteen possible passive shim locations. The thickness and location (e.g., the particular position on a particular shim drawer 22 of a particular superconductive coil assembly 12 or 14) of the passive shims 24 needed to reduce the inhomogeneity of the magnetic field to within a predetermined specification is determined by the repetitive passive shimming method of the present invention.

The preferred method beans with a step portrayed in block 26 of FIG. 1 as "Map Field". This step includes mapping (i.e., measuring) the magnetic field of the open magnet 10. Preferably, such mapping is of the magnetic field in the working magnetic field volume, such as in the imaging volume of an MRI magnet. For a typical magnet, the magnetic field at some 314 points is measured. It is noted that the preferred method of the invention may be used alone for shimming the open magnet 10, or the preferred method may be used before, during, or after conventional or other shimming techniques have been employed on the open magnet 10.

Another step is portrayed in block 28 of FIG. 1 as "Inhomogeneity<Spec". This step includes the substep of calculating the inhomogeneity of the mapped magnetic field of block 26 and the substep of determining if such calculated inhomogeneity is within the predetermined specification. Typically, the inhomogeneity is calculated by subtracting the smallest mapped magnetic field measurement from the largest mapped magnetic field measurement, dividing by the average field (determined from all the measurements), and multiplying by one million to achieve a number representing the peak-to-peak inhomogeneity in parts-per-million (ppm). This step may be skipped the first time through the shimming process. In later repetitions of the shimming method, this step's calculating of the inhomogeneity of the mapped magnetic field would refer to the mapped magnetic field as affected by the added shims 24 of previous repetitions of the shimming method. If the inhomogeneity is within the predetermined specification, the shimming method is stopped as indicated by block 30 in FIG. 1.

If the inhomogeneity is not within the predetermined specification (or that step was omitted, such as for the first time through the shimming method), a further step is performed which is portrayed in block 32 of FIG. 1 as "Check +2, 0 Harmonics". This step includes the substep of determining the amount of positive 2, 0 Legendre polynomial harmonics of the Legendre polynomial expansion of the mapped magnetic field of block 26. This step further includes the substep of calculating a required amount of positive 2, 0 Legendre polynomial harmonics determined by running a computer shim program which calculates the minimum value of positive 2, 0 Legendre polynomial harmonics needed which will allow adding shims to reduce the inhomogeneity of the mapped magnetic field of block 26 to within the predetermined specification. This substep may be skipped the first time through the shimming method by setting the required positive 2, 0 Legendre polynomial harmonics to zero. Preferably, the computer shim program is a conventional computer shim code (which adds shims to minimize the magnetic field inhomogeneity) modified to repeatedly try different values (until a minimum value is found) of positive 2, 0 Legendre polynomial harmonics to be added to the mapped (measured) magnetic field, as is within the purview of those skilled in the art.

A first possibility from block 32 is that the determined amount of positive 2, 0 Legendre polynomial harmonics is greater than the calculated required amount of positive 2, 0 Legendre polynomial harmonics. If this condition is met (or is deemed to be met, such as for the first time through the shimming method), another step is performed which is portrayed in block 34 of FIG. 1 as "Adjust Map". This step includes defining an adjusted magnetic field equal to the mapped magnetic field of block 26 minus a nonzero portion of the determined amount of positive 2, 0 Legendre polynomial harmonics of block 32. Preferably, the nonzero portion is determined by subtracting from the determined amount of positive 2, 0 Legendre polynomial harmonics of block 32, the calculated required amount of positive 2, 0 Legendre polynomial harmonics of block 32. Next, a further step is performed which is portrayed in block 36 of FIG. 1 as "Run Shim Code With Addition". This step includes running a computer shim code which calculates adding shims to reduce the inhomogeneity of the adjusted magnetic field of block 34. Such computer shim codes are conventional, and are within the purview of those skilled in the art. It is noted that in the passive shimming method of the present invention, such computer shim code operates on the adjusted magnetic field of block 34 (instead of conventionally operating on the mapped magnetic field of block 26). Preferably, the nonzero portion mentioned in block 34 is less than the determined amount of positive 2, 0 Legendre polynomial harmonics of block 32 minus the calculated required amount of positive 2, 0 Legendre polynomial harmonics of block 32. Next, an additional step is performed which is portrayed in block 38 of FIG. 1 as "Add Shims". This step includes adding shims to the open magnet 10 as calculated from the running of the computer shim code of block 36. From here, the shimming method is repeated by going again to block 26.

A second (but rare) possibility from block 32 is that the determined amount of positive 2, 0 Legendre polynomial harmonics is exactly equal to the calculated required amount of positive 2, 0 Legendre polynomial harmonics. If this condition is met, the shimming method proceeds directly to block 36 and then block 38, such blocks being described in the previous paragraph.

A third possibility from block 32 is that the determined amount of positive 2, 0 Legendre polynomial harmonics is smaller than the calculated required amount of positive 2, 0 Legendre polynomial harmonics. If this condition is met, there are three options. In the first option, this condition is met before any passive shims have been added by this or a conventional or other shimming method which means that the open magnet 10 cannot be passively shimmed to a low level of inhomogeneity without first creating additional positive 2, 0 Legendre polynomial harmonics such as by increasing the separation between the two superconductive coil assemblies 12 and 14 or by adding full shim drawers 22 and removing some shims 24. In the second option, this condition is met after the last time shims 24 have been added from block 38, and additional positive 2, 0 Legendre polynomial harmonics are created by removing all of the last-time-added shims of block 38 and repeating blocks 26 through 38 using a larger value than previously used for the nonzero portion mentioned in block 34. In the third option, this condition is met after shims 24 have been added from block 38 and a step is performed which is portrayed in block 40 of FIG. 1 as "Define Field Having −2, 0 Harmonics". This step includes defining a magnetic field for the open magnet 10 having only negative 2, 0 Legendre polynomial harmonics. After block 40, a step is performed which is portrayed in block 42 of FIG. 1 as "Run Shim Code With Subtraction". This step includes running a computer shim code which calculates removing shims 24 to create positive 2, 0 Legendre polynomial harmonics to reduce the inhomogeneity of the defined magnetic field of block 40. Of course the computer shim code of block 42 is limited in calculating, for removal, all or a portion of the thicknesses of previously-added shims. Preferably, the determined amount of positive 2, 0 Legendre polynomial harmonics of block 32 plus the created positive 2, 0 Legendre polynomial harmonics of block 42 is at least equal to the calculated required amount of positive 2, 0 Legendre polynomial harmonics of block 32. After block 42, a step is performed which is portrayed in block 44 of FIG. 1 as "Remove Shims. This step removes shims 24 from the open magnet 10 as calculated from the running of the computer shim code of block 42. From here, the shimming method is repeated by going again to block 26.

It is noted that when repeating block 26 of the method, the magnetic field to be mapped is the magnetic field of the open magnet 10 as affected by the previously added shims 24 of block 38 or the previously removed shims 24 of block 44. It is further noted that the "Shim Code With Subtraction" of block 42 preferably is generally identical to the "Shim Code With Addition" of block 36 except for using negative coefficients for shim removal instead of using positive coefficients for shim addition, as can be appreciated by those skilled in the art. Of course the computer shim code of block 36 operates on the adjusted magnetic field of block 34 while the computer shim code of block 42 operates on the defined (negative-2, 0-harmonics-only) magnetic field of block 40.

The foregoing description of a preferred embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

I claim:

1. A method for passively shimming an open magnet having a magnetic field with an inhomogeneity including an amount of positive 2, 0 Legendre polynomial harmonics, said method comprising the steps of:

(a) mapping the magnetic field;

(b) determining the amount of positive 2, 0 Legendre polynomial harmonics of said mapped magnetic field of step (a);

(c) defining an adjusted magnetic field equal to said mapped magnetic field of step (a) minus a nonzero portion of said determined amount of positive 2, 0 Legendre polynomial harmonics of step (b);

(d) running a computer shim code which calculates adding shims to reduce the inhomogeneity of said adjusted magnetic field of step (c); and (e) adding shims to said open magnet as calculated from said running of said computer shim code of step (d).

2. The method of claim 1, wherein said nonzero portion mentioned in step (c) is determined by subtracting from said determined amount of positive 2, 0 Legendre polynomial harmonics of step (b) a required amount of positive 2, 0 Legendre polynomial harmonics determined by running a computer shim code which calculates the minimum value of positive 2, 0 Legendre polynomial harmonics needed which will allow adding shims to reduce the inhomogeneity of said mapped magnetic field of step (a) to within a predetermined specification.

3. The method of claim 1, also including the steps of;

(f) mapping the magnetic field as affected by said added shims of step (e);

(g) determining the amount of positive 2, 0 Legendre polynomial harmonics of said mapped magnetic field of step (f); and (h) calculating a required amount of positive 2, 0 Legendre polynomial harmonics determined by running a computer shim code which calculates the minimum value of positive 2, 0 Legendre polynomial harmonics needed which will allow adding shims to reduce the inhomogeneity of said mapped magnetic field of step (f) to within a predetermined specification.

4. The method of claim 3, also including the step of:

(i) removing all of said added shims of step (e) and repeating steps (a) through (e) using a larger value than previously used for said nonzero portion mentioned in step (c) if said determined amount of positive 2, 0 Legendre polynomial harmonics of step (g) is smaller than said calculated required amount of positive 2, 0 Legendre polynomial harmonics of step (h).

5. The method of claim 3, also including the steps of:

(i) defining a magnetic field for said open magnet having only negative 2, 0 Legendre polynomial harmonics if said determined amount of positive 2, 0 Legendre polynomial harmonics of step (g) is smaller than said calculated required amount of positive 2, 0 Legendre polynomial harmonics of step (h);

(j) running a computer shim code which calculates removing shims to create positive 2, 0 Legendre polynomial harmonics to reduce the inhomogeneity of said defined magnetic field of step (i); and (k) removing shims from said open magnet as calculated from said running of said computer shim code of step (j).

6. The method of claim 5, wherein said determined amount of positive 2, 0 Legendre polynomial harmonics of step (g) plus said created positive 2, 0 Legendre polynomial harmonics of step (j) is at least equal to said calculated required amount of positive 2, 0 Legendre polynomial harmonics of step (h).

7. The method of claim 3, also including the steps of:

(i) defining an adjusted magnetic field equal to said mapped magnetic field of step (f) minus a nonzero portion of said calculated required amount of positive 2, 0 Legendre polynomial harmonics of step (h) if said determined amount of positive 2, 0 Legendre polynomial harmonics of step (g) is greater than said calculated required amount of positive 2, 0 Legendre polynomial harmonics of step (h);

(j) running a computer shim code which calculates adding shims to reduce the inhomogeneity of said adjusted magnetic field of step (i); and (k) adding shims to said open magnet as calculated from said running of said computer shim code of step (j).

8. The method of claim 7, also including the steps of:

(l) mapping the magnetic field as affected by said added shims of steps (e) and (k);

(m) calculating the inhomogeneity of said mapped magnetic field of step (l); and (n) determining if said calculated inhomogeneity of step (m) of said mapped magnetic field of step (l) is within said predetermined specification.

9. The method of claim 7, wherein said nonzero portion mentioned in step (i) is less than said determined amount of positive 2, 0 Legendre polynomial harmonics of step (g) minus said calculated required amount of positive 2, 0 Legendre polynomial harmonics of step (h).

10. The method of claim 9, also including the steps of:

(l) mapping the magnetic field as affected by said added shims of steps (e) and (k);

(m) calculating the inhomogeneity of said mapped magnetic field of step (l); and (n) determining if said calculated inhomogeneity of step (m) of said mapped magnetic field of step (l) is within said predetermined specification.

* * * * *